(12) United States Patent
Jones

(10) Patent No.: US 7,176,760 B2
(45) Date of Patent: Feb. 13, 2007

(54) CMOS CLASS AB FOLDED CASCODE OPERATIONAL AMPLIFIER FOR HIGH-SPEED APPLICATIONS

(75) Inventor: Mark A. Jones, Vail, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 11/096,321

(22) Filed: Mar. 31, 2005

(65) Prior Publication Data

US 2006/0220741 A1  Oct. 5, 2006

(51) Int. Cl.
*H03F 3/45* (2006.01)
(52) U.S. Cl. ............... 330/253; 330/257; 330/258
(58) Field of Classification Search .......... 330/253, 330/257, 258
See application file for complete search history.

(56) References Cited

U.S. PATENT DOCUMENTS

| | | | | |
|---|---|---|---|---|
| 5,631,607 A | * | 5/1997 | Huijsing et al. | ............ 330/253 |
| 5,909,136 A | * | 6/1999 | Kimura | ............ 327/356 |
| 6,377,085 B1 | * | 4/2002 | Giuroiu | ............ 327/66 |
| 6,657,486 B2 | * | 12/2003 | Kimura | ............ 327/563 |
| 6,710,654 B2 | | 3/2004 | Parkhurst et al. | ............ 330/252 |
| 6,822,505 B1 | * | 11/2004 | Palaskas et al. | ............ 327/551 |
| 2001/0001232 A1 | * | 5/2001 | Kung | ............ 330/261 |

* cited by examiner

*Primary Examiner*—Patricia Nguyen
(74) *Attorney, Agent, or Firm*—W. James Brady, III; Frederick J. Telecky, Jr.

(57) ABSTRACT

An operational amplifier (1A or 1B) includes a translinear transconductance stage (2B or 2C) receiving an input signal (Vin) of the operational amplifier and operative to produce a first current ($I_{D18}$) having a square-law relationship to the input signal (Vin) and a folded cascode operational amplifier (3B) including a differential input stage coupled to receive the input signal (Vin), a folded cascode stage coupled to the differential input stage, and a class AB output stage (45) coupled to the folded cascode stage. The differential input stage includes a tail current source (34) coupled to the translinear transconductance stage and operative to produce a square-law tail current ($I_{D34}$) scaled to the first current ($I_{D18}$) to provide a substantially constant input transconductance for a relatively large range of magnitudes of the input signal (Vin).

20 Claims, 3 Drawing Sheets

_US 7,176,760 B2_

CMOS CLASS AB FOLDED CASCODE OPERATIONAL AMPLIFIER FOR HIGH-SPEED APPLICATIONS

BACKGROUND OF THE INVENTION

The invention relates to amplifiers, particularly to low noise, high slew rate CMOS operational amplifiers that includes class AB amplifiers.

High-speed operational amplifiers that are capable of amplifying both small and large magnitude signals with low distortion, low noise, good large-signal handling capability, and high slew rate generally are desirable in analog circuits. Various operational amplifier architectures having some or all of these properties are suitable for high-speed applications in analog circuits. The two main types of voltage feedback operational amplifiers are the folded cascode operational amplifier and the class AB operational amplifier. The folded cascode operational amplifier topology provides relatively low noise, low distortion, high gain, wide bandwidth and good DC performance, but also is characterized by a relatively poor slew rate. The class AB operational amplifier offers improved slew rate but limited large signal handling capability, poor noise performance, and poor DC performance.

The operational amplifier architecture shown in commonly assigned U.S. Pat. No. 6,710,654 entitled "Bipolar Class a Be Folded Cascode Operational Amplifier for High-Speed Applications" issued Mar. 23, 2004 to Parkhurst et al. (which is entirely incorporated herein by reference) greatly improves the linear range of the input signal, and also provides increased slew rate and reduced THD (total harmonic distortion). FIG. 1 shows a schematic diagram of an operational amplifier as disclosed in the foregoing '654 patent. That operational amplifier includes a first stage translinear transconductance circuit 2A, referred to in the '654 patent as a first stage comparator circuit. The translinear transconductance circuit 2A is utilized for biasing a second stage folded cascode amplifier circuit 3A to transform a hyperbolic tangent function to a hyperbolic sine function in order to provide an operational amplifier having low noise amplification with a high slew rate. The operational amplifier disclosed in the '654 patent uses a hyperbolic cosine ("cosh") translinear transconductance stage to bias the input stage tail current transistors to transform the relationship of the tail currents with respect to the differential voltage input from a hyperbolic tangent ("tanh") function to a hyperbolic sine ("sinh") function. The resulting folded cascode operational amplifier, which is implemented using only bipolar transistors, achieves high slew rates without deleteriously affecting its low noise, low distortion, high gain, and wide bandwidth DC performance parameters.

There is an unmet need for an improved CMOS operational amplifier of the type including a class AB output stage which provides low noise and fast slewing.

There also is an unmet need for an improved CMOS operational amplifier of the type including a class AB output stage which provides low noise and fast slewing and also provides substantially improved large-signal handling capability, i.e., substantially improved output dynamic range.

There also is an unmet need for a CMOS operational amplifier having reduced quiescent current, low noise, and fast settling time for a large output voltage step.

SUMMARY OF THE INVENTION

It is an object of the invention to provide an improved CMOS operational amplifier of the type including a class AB output stage which provides low noise and fast slewing.

It is another object of the invention to provide an improved CMOS operational amplifier of the type including a class AB output stage which provides low noise and fast slewing and also provides substantially improved large-signal handling capability, i.e. improved output dynamic range.

It is another object of the invention to provide a CMOS operational amplifier having reduced quiescent current, low noise, and fast settling time for a large output voltage step.

Briefly described, and in accordance with one embodiment, the present invention provides an operational amplifier (1A or 1B) and associated method of operation, the operational amplifier including a translinear transconductance stage (2B or 2C) receiving an input signal (Vin) of the operational amplifier and operative to produce a first current ($I_{D18}$) having a square-law relationship to the input signal (Vin) and a folded cascode operational amplifier (3B) including a differential input stage coupled to receive the input signal (Vin), a folded cascode stage coupled to the differential input stage, and a class AB output stage (45) coupled to the folded cascode stage. The differential input stage includes a tail current source (34) coupled to the translinear transconductance stage and operative to produce a square-law tail current ($I_{D34}$) scaled to the first current ($I_{D18}$) to provide a substantially constant input transconductance for a relatively large range of magnitudes of the input signal (Vin).

In a described embodiment, the translinear transconductance stage (2B or 2C) includes a first pair of input transistors (12, 20) coupled to receive an input signal (Vin) of the amplifier and operable to produce a first current ($I_{D8}$) having a square-law relationship to the input signal (Vin) and a differential stage including a second pair of input transistors (32, 37) coupled to receive the input signal (Vin) and a tail current source (34) coupled to the translinear transconductance stage and operative to produce a square-law tail current ($I_{D34}$) in response to and proportional to the first current ($I_{D18}$). The translinear transconductance stage produces the first current ($I_{D18}$) as a sum of currents flowing through the first pair of transistors (12,20) in a diode-connected transistor (18), wherein the tail current source (34) includes a tail current transistor (34) having its source connected to the source of the diode-connected transistor (18) and its gate connected to the gate and drain of the diode-connected transistor (18) to form a current mirror, and wherein the gain of the current mirror is equal to the channel-width-to-channel-length ratio of the transistors (32, 37) of the second pair divided by the channel-width-to-channel-length ratio of the transistors (12,20) of the first pair. The differential stage includes a folded cascode amplifier (3B) including a differential input stage including the second pair a input transistors (32,37) a folded cascode stage coupled to the differential input stage, and a class AB output stage (45) coupled to the folded cascode stage.

In one embodiment, the invention provides a method of operating a CMOS amplifier in response to an input signal (Vin) to produce low total harmonic distortion (THD) at high signal frequencies including operating a translinear transconductance stage in response to the input signal (Vin) so as to produce a first current ($I_{D18}$) having a square-law relationship to the input signal (Vin) and operating a differential input stage of the amplifier including a pair of input transistors (32,37) in response to the input signal (Vin) and operating a tail current source (34) of the differential input stage in response to the first current ($I_{D18}$) so as to produce a square-law tail current ($I_{D34}$) proportional to the first current ($I_{D18}$) in the tail current source (34) to provide input transconductance substantially more constant than is achievable using a constant value of the tail current for the CMOS amplifier for a substantial range of magnitudes of the input signal (Vin).

In one embodiment, the invention provides a low noise, high slew rate CMOS operational amplifier (1A or 1B) receiving an input signal (Vin) equal to the difference between first (Vin+) and second (Vin−) input signals, the low noise, high slew rate CMOS operational amplifier including a translinear transconductance stage (2B or 2C) including first (12) and second (20) input transistors and third (11) and fourth (21) input transistors, a source of the first input transistor (12) being coupled to a source of the fourth input transistor (21), a source of the second input transistor (20) being coupled to a source of the third input transistor (11), gates of the first (12) and third (11) input transistors being coupled to change in response to the first input signal (Vin+), gates of the second (20) and fourth (21) input transistors being coupled to change in response to the second input signal (Vin−), the translinear transconductance stage being operative to produce a square-law first current ($I_{D18}$) equal to the sum of drain currents of the first (12) and second (20) input transistors. A folded cascode operational amplifier (3B) includes a differential input stage coupled to receive the input signal (Vin), a folded cascode stage coupled to the differential input stage, and a class AB output stage (45) coupled to the folded cascode stage. The differential input stage receives a tail current equal to or proportional to the square-law first current ($I_{D18}$) to provide a substantially constant input transconductance of the low noise, high slew rate CMOS operational amplifier for a substantial range of magnitudes of the input signal (Vin).

In one embodiment, the first (12) and second (20) input transistors have drains coupled to a gate and a drain of a first current source transistor (18), wherein the third (11) and fourth (21) input transistors have drains coupled to a drain of a second current source transistor (19), and wherein the low noise, high-slew-rate CMOS operational amplifier includes a tail current source transistor (34) having a gate coupled to the gate of the first current source transistor (18) so as to cause the tail current source transistor (34) to produce the square-law tail current ($I_{D34}$) proportional to the first current ($I_{D18}$).

In one embodiment, the source of the first input transistor (12) is coupled to the source of the third input transistor (21) by a source degeneration resistor (14) and the source of the second input transistor (20) is coupled to the source of the third input transistor (11) by the same source degeneration resistor (14), wherein the sources of the first (12) and third (11) input transistors are coupled together, and wherein the sources of the second (20) and fourth (21) input transistors are coupled together.

In another embodiment, the source of the first input transistor (12) is directly connected only to the source of the third input transistor (21) and the source of the second input transistor (20) is directly connected only to the source of the third input transistor (11).

Alternatively, the source of the first input transistor (12) is coupled by a first resistor (50) to the source of the third input transistor (21) and the source of the second input transistor (20) is coupled by a second resistor (51) to the source of the third input transistor (11).

The differential input stage may include a fifth input transistor (32) having a gate coupled to the first input signal (Vin+) and a sixth input transistor (37) having a gate coupled to a second input signal (Vin−), sources of the fifth and sixth input transistors being coupled to a drain of the tail current source transistor (34), wherein the differential input stage includes a first current source load transistor (30) having a gate coupled to the gate of the second current source transistor (19) and a drain coupled to a drain of the fifth input transistor (32) and a second (35) current source load transistor having a gate coupled to the gate of the second current source transistor (19) and a drain coupled to a drain of the sixth input transistor (37), wherein the folded cascode stage includes a first (40) cascode transistor having a source coupled to the drain of the fifth input transistor (32) and a second cascode transistor (42) having a source coupled to the drain of the sixth input transistor (37), drains of the first and second cascode transistors being coupled to an input of the class AB output stage. The drains of the first (40) and second (42) cascode transistors are coupled to a common mode voltage generating circuit 43 which generates a common mode signal component at an input of the class AB output stage (45). The first (12) and second (20) input transistors and the second current source transistor (19) may be N-channel transistors and wherein the third (11) and fourth (21) input transistors may be P-channel transistors. The first (12) and second (20) input transistors, the first current source transistor (18), the first (30) and second (35) current source load transistors, and the first (40) and second (42) cascode transistors may be N-channel transistors and the third (11), fourth (21), fifth (32), and sixth (37) input transistors and the first current source transistor (18) may be P-channel transistors.

The first input signal (Vin+) may be coupled directly to the gate of the third input transistor (11) and the second input signal (Vin−) may be coupled directly to the gate of the fourth input transistor (21). The low noise, high-slew-rate CMOS operational amplifier may include a first input signal level shifting circuit (28) for shifting a level of the first input signal (Vin+) and coupling the resulting shifted first input signal level to the gate of the first input transistor (12) and may also include a second input signal level shifting circuit (29) for shifting a level of the second input signal (Vin−) and coupling the resulting shifted second input signal level to the gate of the second input transistor (20). The first input signal level shifting circuit (28) may include a first level shifting transistor (7) having a gate coupled to the first input signal (Vin+) and a source coupled to a source of a diode-connected second level shifting transistor (8) the gate and drain of which are coupled to the gate of the first input transistor (12) and to a first bias current source (10), and wherein the second input signal level shifting circuit (29) may include a third level shifting transistor (23) having a gate coupled to the second input signal (Vin−) and a source coupled to a source of a diode-connected fourth level shifting transistor (24) the gate and drain of which are coupled to the gate of the second input transistor (20) and to a second bias current source (26). The square-law first current ($I_{D18}$) in the first current source transistor (18) may be equal or proportional to a square-law second current ($I_{D19}$) in the second current source transistor (19) which is represented by the equation $$I_{D19} = (\mu Cox/2)(W/L)_{12} \, Vin^2 + 2M^*I_{bias},$$

where $\mu$ is the channel mobility of the first input transistor (12), Cox is the gate capacitance per unit area of the first input transistor (12), $(W/L)_{12}$ is the -to-channel-length ratio of the first input transistor (12), (W/L)$_8$ is the -to-channel-length ratio of the second level shifting transistor (8), M is equal to (W/L)$_{12}$/(W/L)$_8$, and I$_{bias}$ is the magnitude of the current in the first (10) and second (26) bias current sources. The magnitude of the input signal (Vin) preferably is less than or equal to SQRT{I$_{34}$/[(μCox/2)(W/L)$_{32,27}$]}, where μ is the channel mobility of the first input transistor (12), Cox is the gate capacitance per unit area of the first input transistor (12), I$_{34}$ is the tail current through the tail current source transistor (34), (W/L)$_{12}$ is the -to-channel-length ratio of the first input transistor (12), (W/L)$_8$ is the -to-channel-length ratio of the second level shifting transistor (8), M is equal to (W/L)$_{12}$/(W/L)$_8$, and I$_{bias}$ is the magnitude of the current in the first (10) and second (26) bias current source.

DETAILED DESCRIPTION OF THE PREFERRED EMBODIMENTS

Figure 2:
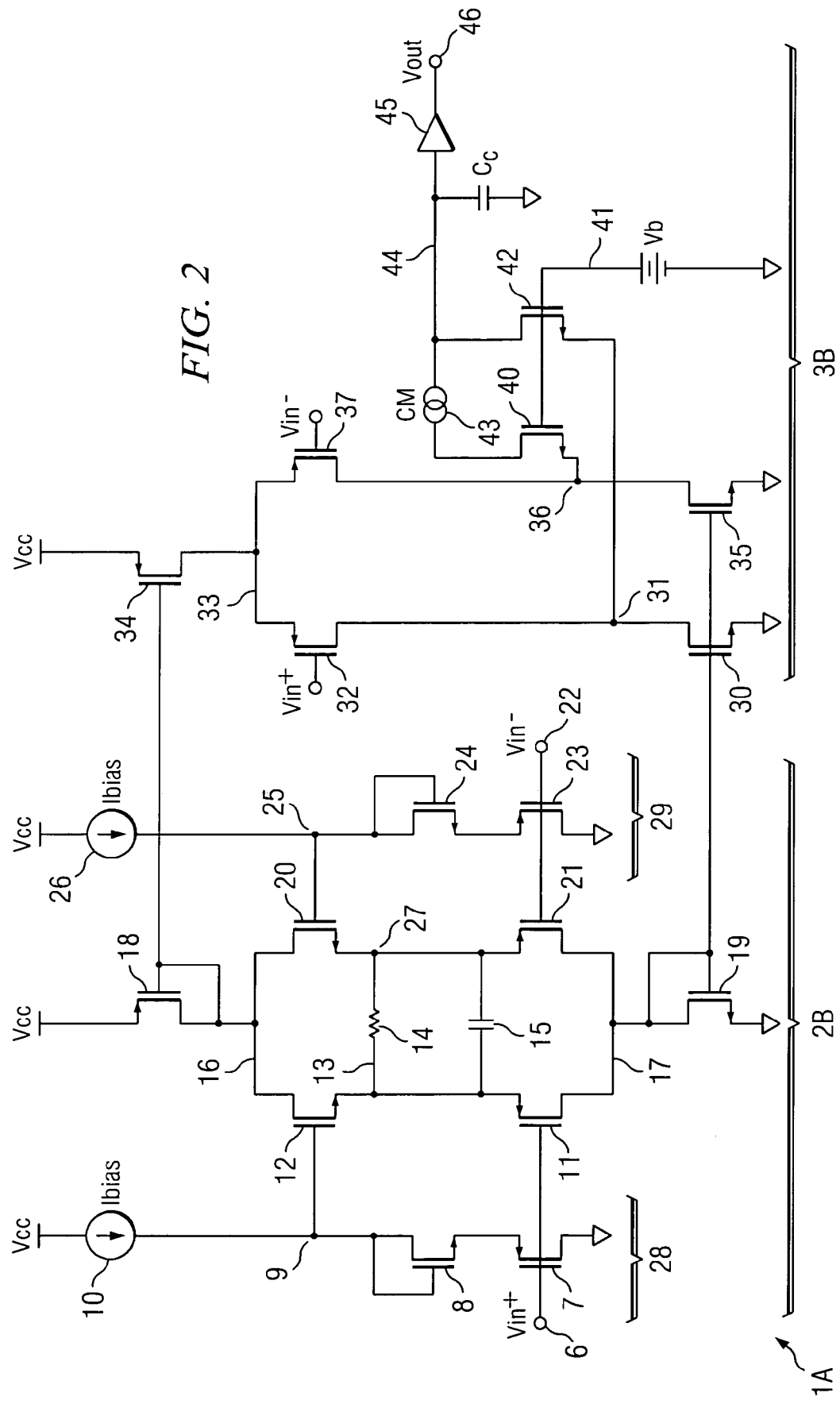
FIG. 2 is a schematic diagram of one embodiment of an operational amplifier of the present invention.

Referring to FIG. 2, operational amplifier 1A includes a translinear transconductance bias stage 2B for biasing a conventional folded cascode operational amplifier stage 3B. The term "translinear" as used herein is intended to refer to a condition in which the large-signal transfer function is non-linear in such a manner that the magnitude of its slope increases with increasing input magnitude. Translinear transconductance bias stage 2B includes N-channel input transistors 12 and 20 having drains connected by conductor 16 to the gate and drain of a P-channel tail current source transistor 18, the source of which is connected to VCC. P-channel input transistors 11 and 21 have drains connected by conductor 17 to the gate and drain of a N-channel transistor tail current source transistor 19, the source of which is connected to a ground conductor (or a VEE conductor). The sources of input transistors 11 and 12 are connected by conductor 13 to one terminal of a source degeneration resistor 14 and to one terminal of an optional speed-up capacitor 15 which boosts transient current for signal edge transitions. The sources of input transistors 20 and 21 are connected by conductor 27 to the other terminal of resistor 14 and the other terminal of capacitor 15.

If Vin is a step function, and if source degeneration resistor 14 has not been replaced by a short-circuit so that there is a voltage across resistor 14, then, capacitor 15 stores the voltage across resistor 14. Then, in response to a step function input signal, the constant voltage across capacitor 15 causes increased currents through transistors 18 and 19 during the step input signal transition by providing a low impedance from one source to the other of the N-channel input transistors 12 and 20 and from one source to the other of the P-channel input transistors 11 and 21.

The differential input voltage Vin of operational amplifier 1A is equal to Vin+−Vin−. Input voltage Vin+ is applied to the gate of input transistor 11 and also to the gate of a P-channel level shift transistor 7. The drain of transistor 7 is connected to ground, and its source is connected to the source of a diode-connected N-channel transistor 8, the gate and drain of which are connected by conductor 9 to the gate of input transistor 12 and to one terminal of a current source 10 which supplies a current equal to Ibias. Transistors 7 and 8 and current source 10 comprise an input level shift circuit 28. Similarly, input voltage Vin− is applied to the gate of input transistor 21 and also to the gate of a P-channel level shift transistor 23. The drain of transistor 23 is connected to ground, and its source is connected to the source of a diode-connected N-channel transistor 24, the gate and drain of which are connected by conductor 25 to the gate of input transistor 20 and to one terminal of a current source 26 which supplies a current equal to Ibias. Transistors 23 and 24 and current source 26 comprises an input level shift circuit 29.

Level shifter circuits 28 and 29 provide a rail-to-rail input voltage range if an internal charge pump is used for the purpose of biasing the a single differential input transistor pair 32, 37 of folded-cascode operational amplifier stage 3B. Other level-shifting circuitry can be used in cases where two separate input transistor pairs are used to an obtain rail-to-rail input voltage range without using a charge pump, or where rail-to-rail common mode inputs are required. Note that in cases where both a pair of N-channel input transistors and a pair of P-channel input transistors are used, the same translinear transconductance stage can be used to bias the tail current source transistor of each pair.

The gate and drain of tail current source transistor 18 are connected to the gate of a P-channel transistor 34, the current through which is scaled with respect to the current through diode-connected tail current transistor 18 which, together with transistor 34, form a current mirror. The source of tail current transistor 18 is connected to VCC. The drain of transistor 34 is connected by conductor 33 to the sources of P-channel input transistors 32 and 37, which are the input transistors of conventional folded cascode operational amplifier 3B. The gate of input transistor 32 is connected to Vin+, and its drain is connected by conductor 31 to the source of an N-channel cascode transistor 42 and to the drain of an N-channel current source transistor 30 having its source connected to ground. Similarly, the gate of input transistor 37 is connected to Vin−, and its drain is connected by conductor 36 to the source of a N-channel cascode transistor 40 and to the drain of an N-channel current source transistor 35, the source of which is connected to ground. The gates of current source transistors 30 and 35 are connected to the gate and drain of diode-connected tail current source transistor 19. Transistors 19, 30 and 35 form a current mirror Current mirror transistors 30 and 35 conduct currents that are suitably scaled with respect to the current through diode-connected tail current source transistor 19.

The gates of cascode transistors 40 and 42 are connected by conductor 41 to a bias voltage Vb. The drain of cascode transistor 40 and the drain of cascode transistor 42 are connected to a common mode voltage circuit 43 that converts a differential drain current I$_{D40}$−I$_{D42}$ of transistors 40 and 42 into a single-ended current and cancels the DC common mode drain current components of transistors 40 and 42. Conductor 44 is connected to one terminal of a compensation capacitance Cc and also to the input of a class AB output stage 45, the output of which is connected by conductor 46 to Vout. (However, in some cases class AB amplifiers may have a differential input applied between their pull-up transistor and pull-down transistor and the differential-to-single-ended conversion occurs as a result of both the pull-up transistor and pull-down transistor being connected to a single output conductor, and the common mode generation function could be included within the class AB stage.) Transistors 30, 35, 40 and 42 form a conventional folded cascode stage. However, other output stages than a class AB output stage could be used. Translinear transconductance stages 2B can be used to bias various other kinds of first differential amplifier input stage which are followed by a second stage biased proportionally to the tail current of the first differential amplifier input stage.

Figure 3:
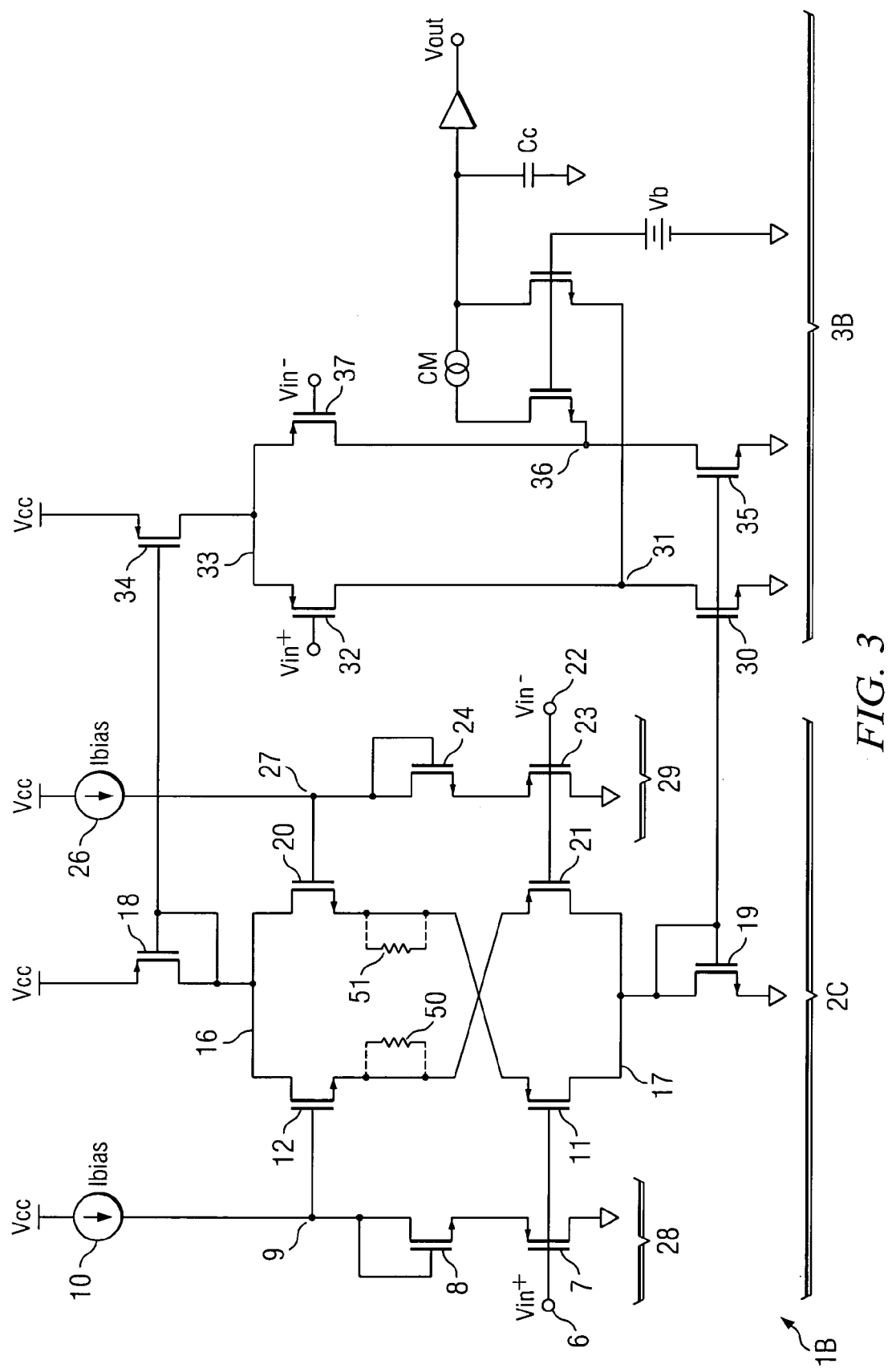
FIG. 3 is a schematic diagram of another embodiment of an operational amplifier of the present invention.

The operational amplifier 1B shown in FIG. 3 includes a translinear transconductance bias stage 2C which differs slightly from translinear transconductance stage 2 of FIG. 2 in that the source of input transistor 12 is cross-coupled directly (or by means of an optional low-value resistance 50 as indicated by dashed lines) to the source of input transistor 21, and the source of input transistor 20 is cross-coupled directly (or by means of an optional low-value resistance 51 as indicated by dashed lines) to the source of input transistor 7, (so resistor 14 and capacitor 15 of FIG. 2 are omitted from FIG. 3).

It should be appreciated, however, that in FIGS. 2 and 3 it is important that the square-law tail current produced by translinear transconductance circuits 2B and 2C, or a scaled representation thereof, be utilized as the tail current for the input transistors 32 and 37. However, it is not necessary to use the same current mirror including diode-connected transistor 18 and tail current source transistor 34 exactly as shown in FIGS. 2 and 3. Those skilled in the art can provide a numerous other ways of mirroring or replicating and scaling a square-law current equal to the sum of the drain currents of input transistors 12 and 20 so as to provide the tail current needed by input transistors 32 and 37 in accordance with the invention. Of course, it does not matter whether the circuitry mirroring or replicating and scaling the square-law current is considered to be contained within the translinear transconductance stage 2B (or 2C) or within the differential input stage including input transistors 32 and 37.

The following mathematical analysis of the translinear transconductance circuit 2B in FIG. 3 is simplified by assuming that the "geometry ratio", meaning the W/L ratio, of transistor 12 divided by the geometry ratio of transistor 8 is equal to the geometry ratio of transistor 11 divided by the geometry ratio of transistor 7. (The term "geometry ratio" W/L of a transistor is its channel width W divided by its channel length L.) Also, the following analysis assumes that the geometry ratios of transistors 8 and 24 are equal, that the geometry ratios of transistors 7 and 23 are equal, that the geometry ratios of transistors 12 and 20 are equal, and that the geometry ratios of transistors 11 and 21 are equal. The analysis also assumes that the magnitudes of the current versus voltage characteristics of transistors 7 and 8 are essentially the same, as indicated in the expression μpCox(W/L)8=μnCox(W/L)7. Also, the analysis assumes that the electrical characteristics of transistors 11, 12, 20, and 21 are, as indicated by the following expression:

$$\mu pCox(W/L)_{11} = \mu nCox(W/L)_{12} = \mu nCox(W/L)_{20} = \mu pCox(W/L)_{21}.$$

Referring to FIG. 3, and assuming that the resistance of resistors 50 and 51 are zero, the drain current $I_{D12}$ of transistor 12 and the drain current $I_{D21}$ 21 are given by the expressions:

$$I_{D12}=(\mu nCox/2)(W/L)_{12}[VGS_{12}-VTn]^2 \text{ and}$$

$$I_{D21}=(\mu pCox/2)(W/L)_{21}(VGS_{12}-VTp)^2, \text{ respectively,}$$

where μn is the channel mobility of N-type transistors, μp is the channel mobility of P-type transistors, Cox is the gate-to-channel capacitance of the transistor per unit area, VGS is the gate-two-source voltage of the transistor, VTn is the threshold voltage of a N-channel transistor, and VTp is the threshold voltage of a P-channel transistor.

Since $I_{D12}=I_{D21}$, then $$(\mu nCox/2)(W/L)_{12}[VGS_{12}-VTn]^2 = (\mu pCox/2)(W/L)_{21}[VGS_{12}-VTp]^2. \quad \text{Eq. (1)}$$

The voltage equation for the loop including Vin, which is equal to Vin+−Vin−, and transistors 7, 8, 12 and 21 is:

$$Vin+VGS7+VG8=VGS12+VGS21. \quad \text{Eq.(2)}$$

Next, expressions must be obtained for VGS7 and VGS8. Note that $$I_{D8}=I_{bias}=(\mu nCox/2)(W/L)_8(VGS8-VTn)^2, \text{ and}$$

$$I_{D7}=I_{bias}=(\mu pCox/2)(W/L)_7(VGS7-VTp)^2.$$

Therefore,
VGS8−VTn=SQRT{$2I_{bias}$/(μnCox(W/L)$_8$}, where SQRT{x} means square root of {x}, and
VGS7−VTp=SQRT{$2I_{bias}$/(μpCox(W/L)$_7$}. Therefore, by substituting into Equation (2), $$Vin+SQRT\{2I_{bias}/(\mu nCox(W/L)_8\}+SQRT\{2I_{bias}/(\mu pCox(W/L)_7\}=(VGS12-VTn)+(VGS21-VTp). \quad \text{Eq.(2-1)}$$

Using the assumption that μpCox(W/L)$_8$=μnCox(W/L)$_7$, and letting
Von12=VGS12−VTn, and also letting Von21=VGS21−VTp, then $$Vin+2SQRT\{2I_{bias}/(\mu nCox(W/L)_8\}=Von12+Von21. \quad \text{Eq.(2-2)}$$

Simplifying Equation (1) results in $$\frac{(\mu nCox/2)(W/L)_{12}}{(\mu pCox/2)(W/L)_{21}} = (VGS21-VTp)^2/(VGS12-VTn)^2$$

$$= (Von21)^2/(Von12)^2.$$

Assuming that transistors 12 and 21 have the same "on" voltage, then Von12=Von21. (This is reasonable assumption, because transistors 12 and 21 conduct the same drain current and it therefore is reasonable assume that their electrical characteristics are essentially the same.) Substituting this into Equation (2-2) results in:

$$Vin+2SQRT\{2I_{bias}/(\mu nCox(W/L)_8\}=2 \text{ Von}12. \text{ Therefore,} \quad \text{Eq.(3-1)}$$

$$Von12=Vin/2+SQRT\{2I_{bias}/(\mu nCox(W/L)_8\}. \text{ Since} \quad \text{Eq.(3-2)}$$

$$I_{D12}=(\mu nCox/2)(W/L)_{12}[Von12]^2,$$

$$I_{D12}=(\mu nCox/2)(W/L)_{12}[Vin/2+SQRT\{2I_{bias}/(\mu nCox(W/L)_8\}]_2, \text{ and}$$

$$I_{D12}=(\mu nCox/2)(W/L)_{12}[Vin^2/4+Vin*SQRT\{2I_{bias}/(\mu nCox(W/L)_8\}+2I_{bias}/(\mu nCox(W/L)_8].$$

Because of the symmetry of translinear transconductance circuit 2C of FIG. 3, the drain current in transistor 20 is the same as in transistor 12, except that the polarity of Vin is reversed. Therefore, $$I_{D20}=(\mu nCox/2)(W/L)_{12}[-Vin/2+SQRT\{2I_{bias}/(\mu nCox(W/L)_8\}]^2, \text{ and}$$

$$I_{D20}=(\mu nCox/2)(W/L)_{12}[Vin^2/4-Vin*SQRT\{2I_{bias}/(\mu nCox(W/L)_8\}+2I_{bias}/(\mu nCox(W/L)_8].$$

The total current flowing into current mirror transistor 19 is $I_{D19}=I_{D12}+I_{D20}$. Therefore, $I_{D19}=(\mu nCox/2)(W/L)_{12}[Vin^2/2+4I_{bias}/(\mu nCox(W/L)_8]$,
and $I_{D19}=(\mu nCox/2)(W/L)_{12}Vin^2+2M*I_{bias}$, where M is equal to $(W/L)_{12}/(W/L)_8$.

The term $(\mu nCox/2)(W/L)_{12}Vin^2$ is a square law component, and the term $2M*I_{bias}$ is a DC component.

Note that the expression for tail current $I_{D19}$ is replicated to provide an expression for tail current $I_{D18}$, which is scaled to generate the tail current $I_{D34}$ for input transistors 32 and 37.

The above equations for the "cross-coupled" embodiment of FIG. 3 are also applicable to the embodiment of FIG. 2 if the resistance of resistor 14 is zero, because the cross-coupled source voltages of transistors 7 and 21 are equal, given the simplifying assumptions that have been made. Therefore, the sources of transistors 11, 12, 20 and 21 could all be electrically connected together without any change of circuit operation.

For small signal values of Vin, the tail currents are $I_{D18}$ and $I_{D19}$ are essentially constant. However, under small-signal conditions the performance of operational amplifier 1B of FIG. 3 is essentially identical to the operation of a conventional CMOS operational amplifier, but for larger-signal conditions the increased tail current resulting from a square-law component of $I_{D18}$ and $I_{D19}$ provides more current available to charge and discharge the compensation capacitor Cc and more bias current to overcome the internal parasitics. This results in a faster slew rate and larger full-signal bandwidth than has been achieved in prior CMOS operational amplifiers.

The operational amplifiers shown in FIGS. 2 and 3 provide boosted tail currents at high input voltages, which allows the use of substantially lower quiescent current and reduced power during times of low input signal magnitude.

Thus, the invention provides a CMOS operational amplifier which provides large-signal capability, operates essentially the same way as conventional CMOS operational amplifiers, and also retains the main advantages of conventional CMOS operational amplifier architectures. The modulation of the tail current $I_{D34}$ of the input stage transistors 32 and 37 avoids adding any additional parasitic signal components in the AC signal path, and instead the change in the bias current $I_{D34}$ appears to be a common mode signal with respect to the AC signal path. The above described generation of a square-law modulated tail current therefore allows for faster slew rates without compromising AC characteristics of the operational amplifier.

Furthermore, as subsequently explained, the choice of a square-law tail current with a standard CMOS differential input transistor pair helps maintain a constant input transconductance of the CMOS differential input transistor pair for moderately large input signals. The use of the square-law tail current also has the advantage of allowing a smooth transition from a large-signal operational amplifier response to small-signal operation, thereby improving output settling time, which also is the case for the bipolar implementation of the '654 patent. However, it should be noted that it is possible to scale the current source in such a way that the input transconductance is not substantially constant, and nevertheless reap benefits of the above described CMOS implementations such as improved slew rate, settling time, and full power bandwidth. The THD may also be improved, although not optimized, for that case.

A square-law tail current is used instead of the exponential tail current in the '654 patent in order to obtain the above relatively constant transconductance of the differential input transistor pair. Furthermore, the tail current of the differential input transistor pair must be scaled to a certain magnitude and the magnitude of the input voltage of the differential input transistor pair must be under a certain threshold in order to achieve the approximately constant transconductance.

A well-known equation for the differential drain current flowing through a pair of source-coupled N-channel transistors taken, for example, from "Analysis and a Design of Analog Integrated Circuits" by Paul R. Gray and Robert C. Meyer, is given by the following equation:

$$\Delta Id=(\mu nCox/2)(W/L)\Delta Vi*SQRT\{[2Iss]/[\mu nCoxW/(2L)]-(\Delta Vi)^2\},$$

$$\text{for } \Delta Vi \leq SQRT\{Iss/[(\mu nCox/2)(W/L)]\}. \qquad \text{Eq. (4)}$$

Adapting Equation (4) to the source-coupled transistor pair including transistors 32 and 37, if the tail current $Iss=I_{D34}=R*I_{D18}=R*I_{D19}=R[\mu nCox/4)(W/L)_{12}Vin^2+R*2M*Ibias]$, where R is equal to the current mirror gain of transistors 18 and 34 and $\Delta Vi=Vin$ and where M is equal to $(W/L)_{12}/(W/L)_8$, then $$\Delta Id = (\mu nCox/2)(W/L)_{32,27}Vin* \qquad \text{Eq. (4-1)}$$

$$SQRT\left\{\left[\frac{2R\left(\frac{\mu nCox}{4}\right)\left(\frac{W}{L}\right)_{12}}{\left(\frac{\mu nCox}{2}\right)\left(\frac{W}{L}\right)_{32,27}}Vin^2+4R*M*Ibias\right]-Vin^2\right\},$$

$$= (\mu nCox/2)(W/L)_{32,27}Vin*$$

$$SQRT\left\{R\left(\frac{W}{L}\right)_{12}\frac{Vin^2}{\left[\left(\frac{W}{L}\right)_{32,27}\right]}-\frac{Vin^2+4R*M*Ibias}{\left[\left(\frac{\mu nCox}{2}\right)\left(\frac{W}{L}\right)_{32,27}\right]}\right\}.$$

If $R=((W/L)_{32,27})/(W/L)_{12}$, then the $Vin^2$ terms cancel, and $$\Delta Id=(\mu nCox/2)(W/L)_{32,27}Vin*SQRT\{[4R*M*Ibias]/(\mu nCox/2)(W/L)_{32,27}]\}. \qquad \text{Eq. (4-2)}$$

Therefore, $\Delta Id$ is linear, and therefore the transconductance $\partial \Delta Id/\partial Vin$ is constant for the condition that $Vin \leq SQRT\{I_{34}/[(\mu nCox/2)(W/L)_{32,27}]\}$.

From a practical viewpoint, the relatively constant transconductance of the input transistor pair 32, 37 over the indicated input voltage range is much more constant than is the case for a bipolar transistor implementation of the same circuit. The constant transconductance allows substantially lower THD (total harmonic distortion) of the operational amplifier at high frequencies than can be achieved for a bipolar transistor implementation having the same gain bandwidth product.

It should be appreciated that it is possible to achieve substantial improvements in slew rate performance even if the square law current component is smaller or larger than an optimum value which results in substantially constant input transconductance. Using a smaller than optimum square law current component will make the input transconductance have a finite, but not constant, value for moderate to large input signals. Or, using a larger than optimum square law current component will make the input transconductance have a greatly increased slew rate, even though the THD is not optimized.

It should be appreciated that those skilled in the art know that for various reasons an MOS circuit obtained by simply substituting MOS transistors for bipolar transistors usually does not operate satisfactorily. The turn-on threshold voltages of MOS transistors and bipolar transistors are approximately the same, but the operating gate-source voltages of MOS transistors usually are much higher than the base-emitter voltages for corresponding NPN are PNP bipolar transistors. Most importantly, MOS transistors in operate fundamentally different ways than bipolar transistors. Bipolar transistors have fundamentally different current-voltage characteristics than MOS transistors, as bipolar transistors have exponential current-voltage characteristics, in contrast to MOS transistors which have square-law current-voltage characteristics. Therefore, the large-signal transconductances of bipolar transistors and MOS transistors are fundamentally different.

These fundamental differences causes bipolar transistors and MOS transistors to be very non-equivalent in many practical applications. For example, in the prior art circuit of FIG. 1, the presence of the series resistor between the emitters of transistors Q13 and Q14 helps create the needed mathematical function and corresponding improved function when bipolar transistors, which have an exponential current-two-voltage relationship are used. In contrast, when MOS transistors, which have a square-law current-to-voltage relationship, are used, the resistor referred to results in a diminished, rather than improved, function. Furthermore, a bipolar transistor requires a substantial base current in order to operate, and has a relatively low base input impedance, in contrast to an MOS transistor which has an essentially infinite gate impedance and essentially zero gate current. Consequently, transistor biasing requirements usually are very different in circuits implemented by means of bipolar transistors than in circuits implemented by means of MOS transistors. Generally, substantial modification of a bipolar transistor circuit is required in order to provide MOS circuitry having satisfactory performance.

Figure 1:
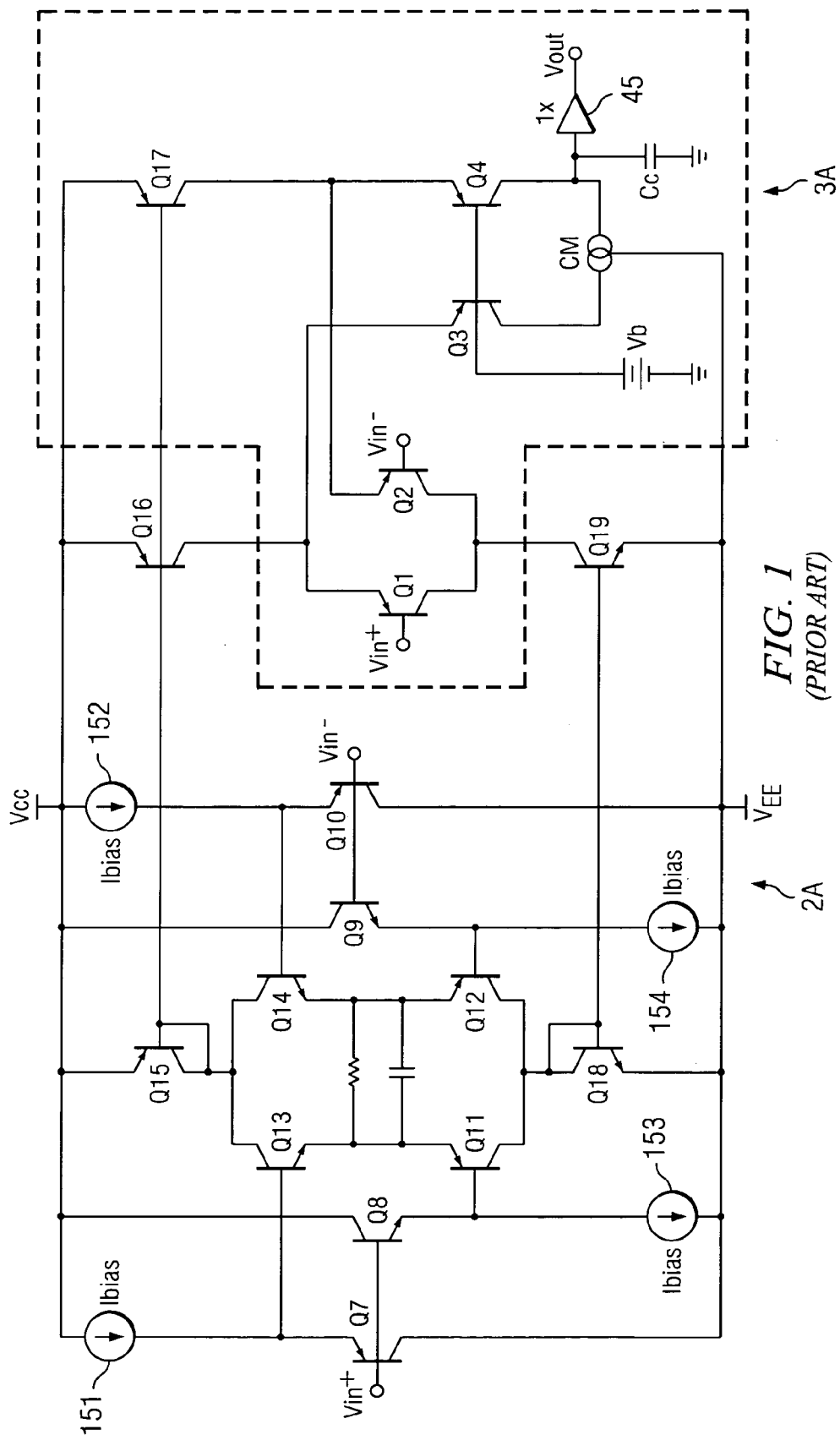
FIG. 1 is a schematic diagram of a prior art operational amplifier.

Therefore, it is believed that nothing in the prior art indicates recognition that the topography of the prior art circuit in FIG. 1 could be advantageously used for implementation of a comparable operational amplifier by using square-law transistors. To the contrary, all of the disclosure and teaching of the '654 patent is directed to an exclusively bipolar implementation and focuses and depends heavily on the exponential current-voltage characteristics of bipolar transistors.

Since using a circuit topography designed for a bipolar transistor implementation usually does not provide satisfactory performance if the bipolar transistors are replaced by CMOS transistors, it is thought to be quite surprising the CMOS circuitry shown in FIGS. 2 and 3 circuit provides excellent circuit performance.

To summarize, the present invention provides a CMOS operational amplifier having low THD (total harmonic distortion) for high-frequency signals, high slew rate, wide dynamic range or large full-signal bandwidth, low noise, and low quiescent current.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An amplifier comprising:
   (a) a translinear transconductance stage including a first pair of input transistors coupled to receive an input signal of the amplifier and operable to produce a first current having a square-law relationship to the input signal; and
   (b) a differential stage including a second pair of input transistors coupled to receive the input signal and a tail current source coupled to the translinear transconductance stage and operative to produce a square-law tail current in response to and proportional to the first current.

2. The amplifier of claim 1 wherein the translinear transconductance stage produces the first current as a sum of currents flowing through the first pair of transistors in a diode-connected transistor, and wherein the tail current source includes a tail current transistor having a source connected to a source of the diode-connected transistor and a gate connected to a gate and drain of the diode-connected transistor to form a current mirror, and wherein the gain of the current mirror is equal to the channel-width-to-channel-length ratio of the input transistors of the second pair divided by the channel-width-to-channel-length ratio of the input transistors of the first pair.

3. The amplifier of claim 2 wherein the differential stage includes a folded cascode amplifier including a differential input stage including the second pair of input transistors and a folded cascode stage coupled to the differential input stage, and a class AB output stage coupled to the folded cascode stage.

4. A low noise, high slew rate CMOS operational amplifier receiving an input signal equal to the difference between first and second input signals, the low noise, high slew rate CMOS operational amplifier comprising:
   (a) a translinear transconductance stage including first and second input transistors and third and fourth input transistors, a source of the first input transistor being coupled to a source of the fourth input transistor, a source of the second input transistor being coupled to a source of the third input transistor, gates of the first and third input transistors being coupled to change in response to the first input signal, gates of the second and fourth input transistors being coupled to change in response to the second input signal, the translinear transconductance stage being operative to produce a square-law first current equal to the sum of drain currents of the first and second input transistors; and
   (b) a folded cascode operational amplifier including a differential input stage coupled to receive the input signal, a folded cascode stage coupled to the differential input stage, and a class AB output stage coupled to the folded cascode stage,
   the differential input stage receiving a tail current equal to or proportional to the square-law first current to provide input transconductance substantially more constant than is achievable using a constant value of the tail current for the low noise, high slew rate CMOS operational amplifier for a substantial range of magnitudes of the input signal.

5. The low noise, high-slew-rate CMOS operational amplifier of claim 4 wherein the first and second input transistors have drains coupled to a gate and a drain of a first current source transistor, wherein the third and fourth input transistors have drains coupled to a gate and drain of a second current source transistor, and wherein the differential input stage includes a tail current source transistor having a gate coupled to a gate of the first current source transistor so as to cause the tail current source transistor to produce the tail current equal to or proportional to the first current.

6. The low noise, high-slew-rate CMOS operational amplifier of claim 5 wherein the source of the first input transistor is coupled to the source of the third input transistor by a source degeneration resistor and the source of the second input transistor is coupled to the source of the third input transistor by the source degeneration resistor, and wherein the sources of the first and third input transistors are coupled together, and wherein the sources of the second and fourth input transistors are coupled together.

7. The low noise, high-slew-rate CMOS operational amplifier of claim 5 wherein the source of the first input transistor is directly connected to the source of the third input transistor and the source of the second input transistor is directly connected to the source of the third input transistor.

8. The low noise, high-slew-rate CMOS operational amplifier of claim 5 wherein the source of the first input transistor is directly connected only to the source of the third input transistor and the source of the second input transistor is directly connected only to the source of the third input transistor.

9. The low noise, high-slew-rate CMOS operational amplifier of claim 5 wherein the source of the first input transistor is coupled by a first resistor to the source of the third input transistor and the source of the second input transistor is coupled by a second resistor to the source of the third input transistor.

10. The low noise, high-slew-rate CMOS operational amplifier of claim 5 wherein the differential input stage includes a fifth input transistor having a gate coupled to the first input signal and a sixth input transistor having a gate coupled to the second input signal, sources of the fifth and sixth input transistors being coupled to a drain of the tail current source transistor, wherein the differential input stage includes a first current source load transistor having a gate coupled to the gate of the second current source transistor and a drain coupled to a drain of the fifth input transistor and a second current source load transistor having a gate coupled to the gate of the second current source transistor and a drain coupled to a drain of the sixth input transistor, and wherein the folded cascode stage includes a first cascode transistor having a source coupled to the drain of the fifth input transistor and a second cascode transistor having a source coupled to the drain of the sixth input transistor, drains of the first and second cascode transistors being coupled to an input of the class AB output stage.

11. The low noise, high-slew-rate CMOS operational amplifier of claim 10 wherein drains of the first and second cascode transistors are coupled to a common mode voltage generating circuit which generates a common mode signal component at the input of the class AB output stage.

12. The low noise, high-slew-rate CMOS operational amplifier of claim 5 wherein the first and second input transistors and the second current source transistor are N-channel transistors and wherein the third and fourth input transistors are P-channel transistors.

13. The low noise, high-slew-rate CMOS operational amplifier of claim 11 wherein the first and second input transistors, the first current source transistor, the first and second current source load transistors, and the first and second cascode transistors are N-channel transistors and wherein the third, fourth, fifth, and sixth input transistors and the first current source transistor are P-channel transistors.

14. The low noise, high-slew-rate CMOS operational amplifier of claim 5 wherein the first input signal is coupled directly to the gate of the third input transistor and the second input signal is coupled directly to the gate of the fourth input transistor, the low noise, high-slew-rate CMOS operational amplifier including a first input signal level shifting circuit for shifting a level of the first input signal and coupling the shifted first input signal level to the gate of the first input transistor and also including a second input signal level shifting circuit for shifting a level of the second input signal and coupling the shifted second input signal level to the gate of the second input transistor.

15. The low noise, high-slew-rate CMOS operational amplifier of claim 14 wherein the first input signal level shifting circuit includes a first level shifting transistor having a gate coupled to the first input signal and a source coupled to a source of a diode-connected second level shifting transistor a gate and drain of which are coupled to the gate of the first input transistor and to a first bias current source, and wherein the second input signal level shifting circuit includes a third level shifting transistor having a gate coupled to the second input signal and a source coupled to a source of a diode-connected fourth level shifting transistor a gate and drain of which are coupled to the gate of the second input transistor and to a second bias current source.

16. The low noise, high-slew-rate CMOS operational amplifier of claim 5 wherein the first, second, third, and fourth input transistors have substantially matched electrical characteristics.

17. The low noise, high-slew-rate CMOS operational amplifier of claim 14 wherein the square-law first current in the first current source transistor is equal to a square-law second current in the second current source transistor which is represented by the equation $$I_{D19}=(\mu Cox/2)(W/L)_{12}Vin^2+2M*I_{bias},$$

where $\mu$ is the channel mobility of the first input transistor, Cox is the gate capacitance per unit area of the first input transistor, $(W/L)_{12}$ is the -to-channel-length ratio of the first input transistor, $(W/L)_8$ is the -to-channel-length ratio of the second level shifting transistor, M is equal to $(W/L)_{12}/(W/L)_8$, and $I_{bias}$ is the magnitude of the current in the first and second bias current sources.

18. The amplifier of claim 14 wherein the magnitude of the input signal is less than or equal to $SQRT\{I_{34}/[(\mu Cox/2)(W/L)_{32,27}]\}$, where $\mu$ is the channel mobility of the first input transistor, Cox is the gate capacitance per unit area of the first input transistor, $I_{34}$ is the tail current through the tail current source transistor, $(W/L)_{12}$ is the -to-channel-length ratio of the first input transistor, $(W/L)_8$ is the -to-channel-length ratio of the second level shifting transistor, M is equal to $(W/L)_{12}/(W/L)_8$, and $I_{bias}$ is the magnitude of the current in the first and second bias current source.

19. A method of operating a CMOS amplifier in response to an input signal to produce low total harmonic distortion (THD) at high signal frequencies, comprising:

(a) operating a translinear transconductance stage in response to the input signal so as to produce a first current having a square-law relationship to the input signal; and (b) operating a differential input stage of the CMOS amplifier including a pair of source-coupled input transistors in response to the input signal and operating a tail current source of the differential input stage in response to the first current so as to produce a square-law tail current proportional to the first current in the tail current source to provide an input transconductance substantially more constant than is achievable using a constant value of the tail current for the CMOS amplifier for a substantial range of magnitudes of the input signal.

20. The method of claim 19 including driving a folded cascode stage from outputs of the differential input stage and driving a class AB output stage in response to outputs of the folded cascode stage.

* * * * *